United States Patent [19]
Granestrand

[11] Patent Number: 6,014,250
[45] Date of Patent: Jan. 11, 2000

[54] LASER AMPLIFIER, AN OPTICAL SYSTEM COMPRISING SUCH A LASER AMPLIFIER AND A METHOD OF FORMING SUCH A LASER AMPLIFIER

[75] Inventor: Per Granestrand, Tyresö, Sweden

[73] Assignee: Telefonaktiebolaget LM Ericsson, Stockholm, Sweden

[21] Appl. No.: 08/930,182

[22] PCT Filed: May 3, 1996

[86] PCT No.: PCT/SE96/00587

§ 371 Date: Feb. 13, 1998

§ 102(e) Date: Feb. 13, 1998

[87] PCT Pub. No.: WO96/35248

PCT Pub. Date: Nov. 7, 1996

[30] Foreign Application Priority Data

May 4, 1995 [SE] Sweden ............................. 9501667

[51] Int. Cl.⁷ ................................................. H01S 3/19
[52] U.S. Cl. ..................... 359/344; 359/337; 372/45; 372/50; 257/17
[58] Field of Search ................................. 359/337, 344; 372/20, 43, 45, 50; 257/13, 17, 431

[56] References Cited

U.S. PATENT DOCUMENTS

4,839,899 6/1989 Burnham et al. .
5,274,656 12/1993 Yoshida .
5,363,392 11/1994 Kasukawa et al. .
5,406,574 4/1995 Rennie et al. .

OTHER PUBLICATIONS

D. Teng et al., "Effects of Non–Uniform Well Width on Compressively Strained Multiple Quantum Well Lasers," *Applied Phys. Letter*, vol. 60, pp. 2729–2731, 1992.

Newkirk, et al, IEEE Phootnics Technology Letters, vol. 5, #4, pp. 406–408; Abst. Only Herewith, Apr. 1993.

Magari et al, IEEE S.Q.E., vol. 30, #3, pp. 695–702; Abst.Only Herewith, Mar. 1994.

Kasukawa et al, Jap. Jour. App. Phys., p. 1, vol. 31, No. 5A, pp. 1365–1371, May 1992.

Kasukawa et al, App. Phys. Lett., vol. 59, #20, pp. 2486–2488; abst. only herewith, Nov. 11, 1991.

*Primary Examiner*—Nelson Moskowitz
*Attorney, Agent, or Firm*—Burns, Doane, Swecker &Mathis, L.L.P.

[57] ABSTRACT

A laser amplifier, an optical system comprising such a laser amplifier and a method of forming such a laser amplifier for obtaining polarization independent amplification over a large wavelength region. The optical amplifier comprises an active region that is formed on a semiconductor substrate (6). The active layer has been formed through growing of quantum well layers (13, 14, 15, 16) alternating with barrier layers (12). The well layers comprise well layers of a first type (14, 15, 16) having tensile strain together with or without well layers of a second type having compressive strain (13). At least one of the well layers of one type (16) has been grown to a different width and/or with a different material composition than the other well layers of the same type (14, 15).

26 Claims, 5 Drawing Sheets

LASER AMPLIFIER, AN OPTICAL SYSTEM COMPRISING SUCH A LASER AMPLIFIER AND A METHOD OF FORMING SUCH A LASER AMPLIFIER

TECHNICAL FIELD OF THE INVENTION

The present invention relates to the field of optical systems including optical fibers and more particularly to the field of laser amplifiers in such optical systems as well as to methods of forming such laser amplifiers.

DESCRIPTION OF RELATED ART

Semi-Conductor Laser Amplifiers (SCLA) are expected to be important components in future optical systems. One important reason for this is their ability to amplify signals in the optical domain without converting them to the electrical domain. This gives flexibility regarding bit rates and code formats. Another reason is their small physical dimensions and suitability for integration (can for example be used as gating switch elements in optical switch matrices). A simple SCLA can consist of an anti reflection coated semiconductor laser.

However there exists a problem in these devices, which has to do with the polarization sensitivity of SCLAs. At the output of an ordinary single mode fiber the state of polarization (SOP) is fluctuating randomly due to temperature variations and mechanical disturbances despite the fact that the laser source has a well defined SOP. The simplest form of the SCLA does not have a polarization independent amplification. This means that it is incompatible with ordinary fibers if constant signal levels are required. This is a major drawback.

However there exist some designs for polarization independent laser amplifiers. One simply consists of making the waveguide of the laser amplifier more square. This makes the TE- and TM-modes of the light more equal. One problem with this approach is however that a smaller line width and thicker layer thickness than in conventional laser fabrication has to be used, which will lower the yield drastically in for example a laser amplifier gate switch matrix. Another problem with the laser amplifiers of this type is that they may saturate when amplifying strong input signals and thus do not work linearly under these circumstances.

Another approach for polarization independent laser amplifiers, which is more compatible with standard laser fabrication, make use of structures with two strained quantum well types, one with compressive strain and one with tensile strain. The strain results when the well layers have compositions that by themselves do not give lattice constants that are matched to the substrate of the amplifier. The compressive wells contribute to the TE-gain and the tensile wells contribute mostly to the TM-gain (they however contribute slightly to the TE-gain as well). Another advantage of this approach compared with the previous one is that the polarization dependency in the solitary SCLA can be tailored to compensate the polarization dependent losses in the rest of the chip (e. g. in the passive interconnecting waveguides or in waveguide crossovers and y-junctions).

This approach does however have one problem. This is the small wavelength operation region that is obtained. This is due to the fact that the different kinds of strained quantum wells have different wavelength dependencies, which limits the effectiveness of the amplifier to a small wavelength region and a system with such amplifiers will therefore be limited to a small variety of laser sources.

Another problem with these limitations of the amplifier with layers having strain is that it is difficult to amplify signals with the same gain if they have different wavelengths.

It therefore exists a need within the field of a laser amplifier, which has a polarization independent behaviour over a large wavelength region and which at the same time does not saturate when strong signals are used.

In the article "Effects of nonuniform well width on compressively strained multiple quantum well lasers", D Teng et al, Appl. Phys. Lett., Vol 60 (1992), p 2729–2731 a quantum well laser is described, which has compressive wells, the width of which have been varied. In the article, which is directed to a laser source and not a laser amplifier, the authors note that the varied widths in compressively strained wells give rise to a wider wavelength region.

In U.S. Pat. No. 5,363,392 a semiconductor laser device is described, which has quantum wells with tensile strain separated by barrier layers with compressive strain. The widths or the material compositions of the wells as well as the barriers can be varied. This document is directed towards problems encountered in laser sources and the aim is to obtain a device which works well with low threshold currents at high temperatures. This document does not describe problems concerning amplification of optical signals or the way such problems can be solved.

None of the above mentioned documents concern laser amplifiers which are polarization independent over a large wavelength region.

SUMMARY OF THE INVENTION

One object of the present invention is to obtain a method of forming a laser amplifier of the quantum well type that can achieve polarization independent amplification of optical signals over a large wavelength region.

This object is achieved through the use of a method for forming an active region on a semiconductor substrate in a laser amplifier comprising growing of well layers alternating with barrier layers. The well layers comprise a first type that has tensile strain together with or without a second type that has compressive strain. Of these well layers at least one of one type is grown to a different width and/or with a different material composition than the other well layers of the same type.

Another object of the present invention is to obtain a laser amplifier of the quantum well type that has polarization independent amplification of optical signals over a large wavelength region.

This object is achieved through a laser amplifier that has an active region that comprises quantum wells separated by barriers, which wells comprise wells of a first type having tensile strain together with or without wells of a second type having compressive strain. Of these wells at least one of one type has a different width and/or different material composition than the rest of the wells of the same type.

Another object is to obtain an optical system that comprises at least one laser amplifier of the quantum well type that has polarization independent amplification of optical signals over a large wavelength region.

This is achieved through an optical system that comprises a laser amplifier comprising an active region comprising quantum wells that are separated by barriers, which wells comprise wells of a first type having tensile strain together with or without wells of a second type having compressive strain. Of these wells in the laser amplifier at least one of one type has a different width and/or different material composition than the rest of the wells of the same type.

With the present invention laser amplifiers are obtained that are compatible with ordinary fibers when constant signal levels are required.

With the present invention a laser amplifier and an optical system are also obtained where the TM- and TE-modes of any signal that lies within a desired wavelength region are amplified substantially with equal gain.

With the present invention a laser amplifier is obtained that has a polarisation independent amplification over a large wavelength region that is substantially better than in quantum well laser amplifiers of the prior art.

In the specification the term layer product is used. It is here defined as the width of a layer in the active region of a laser amplifier multiplied with the strain of said layer, where the strain is expressed in percent. A tensile strain is here defined as having a positive sign and a compressive strain is defined as having a negative sign.

DETAILED DESCRIPTION OF EMBODIMENTS

Embodiments of the present invention will be described with reference to the attached drawings in the following section.

Figure 1:
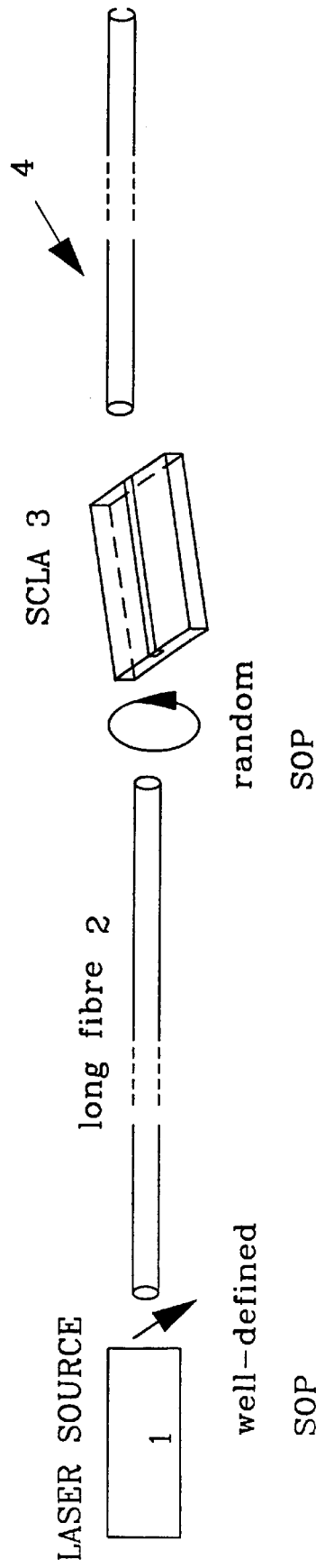
FIG. 1 is a schematic view showing some of the parts of an optical system according to the present invention.

In FIG. 1 a schematic view of some of the parts of an optical system according to the invention is shown. The optical system comprises a laser source 1, a long optical fiber 2, a semiconductor laser amplifier (SCLA) 3 and yet another fiber 4, which could be connected to yet another SCLA, an amplifier of another type, a repeater, a receiver etc. (not shown). It should be understood that the different parts of the system, as opposed to in the figure, are closely connected to one another in order for as much light as possible to travel within the fibers and the amplifier. The laser source 1 emit signals that have a certain wavelength and a well defined state of polarization (SOP). As the signals travel through the long fiber 2 the polarization is affected by temperature variations and mechanical disturbances so that the state of polarization is fluctuating randomly at the end of the fiber 2 facing the SCLA 3. The amplifier 3 according to the invention then amplifies the input signals independently of the polarization when these signals have a wavelength within a wavelength region that is quite large and outputs the amplified signals to the fiber 4.

Figure 2A:
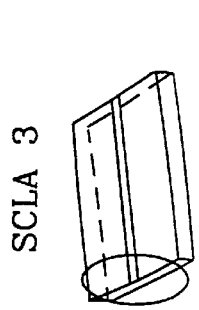
FIG. 2a is a schematic perspective view of a laser amplifier according to the prior art.
Figure 2B:
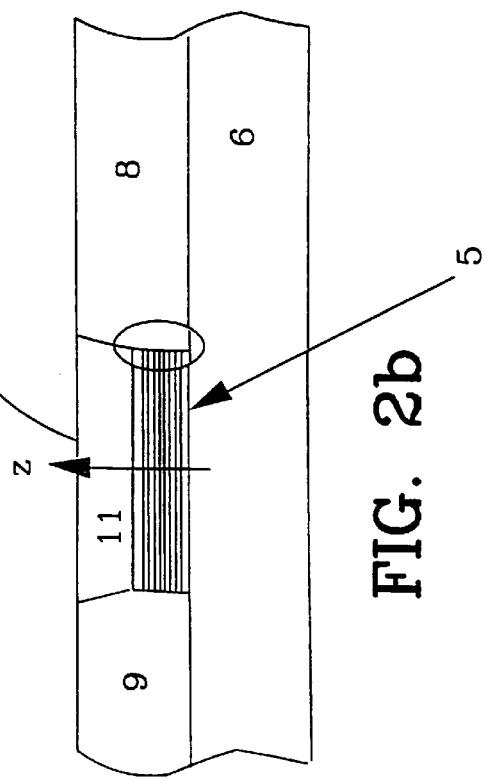
FIG. 2b is an end view of an encircled part of the laser amplifier in FIG. 2a showing the active region and the layers enclosing it.

FIGS. 2a–2d serve the purpose of showing the quantum well structure of a SCLA. In FIG. 2a a known SCLA 3 is shown. In FIG. 2b an end view of a part of the SCLA, which is encircled in FIG. 2a, is shown. The view shows the active region 5, which is grown on a substrate 6 and surrounded by blocking layers 8 and 9. On top of the active region 5 a contact layer 11 is disposed. The active region 5 could also have had claddings or other types of confinement layers included between the quantum well region and the substrate and the quantum well region and the contact layer 11. In this figure the growth direction is designated z. An injection current is also shown supplied to the contact layer for operating the amplifier.

Figure 2C:
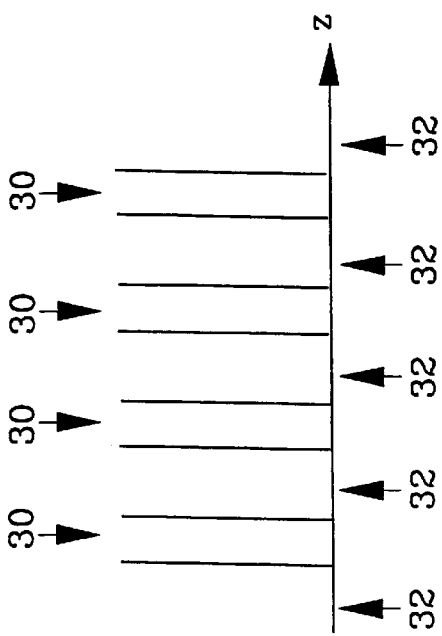
FIG. 2c is an enlarged view schematically showing the structure of the active region in an encircled part of FIG. 2b.

In FIG. 2c an enlarged view of the active region 5 that is encircled in FIG. 2b is shown. The layers in the active region are stacked along the growth direction z with alternating well layers 30 and barrier layers 32. The well layers 30 in this known active region 5 can be of a first type having tensile strain and/or of a second type having compressive strain, and all the well layers of the first type have the same width, i.e. 10 nm, and all the layers of the second type have the same width, that can be different from the width of the well layers of the first type. All the barrier layers 32, perhaps with the exception for the innermost layer facing the substrate and the outermost layer facing the contact layer 11, have the same width, i.e. 10 nm.

Figure 2D:
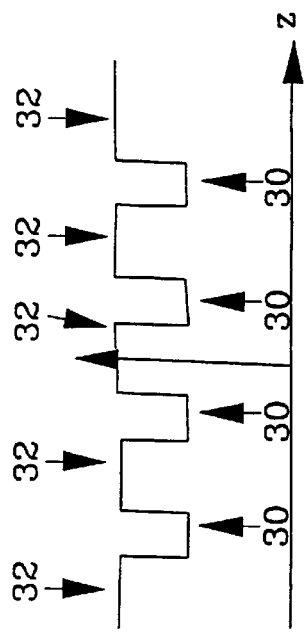
FIG. 2d shows part of the energy diagram for the layers shown in FIG. 2c.

FIG. 2d shows the energy diagram for the band edges of the conduction band corresponding to layers in FIG. 2c, with the quantum wells and barriers stacked along the growth direction z. The valence band is omitted in this figure. Amplification takes place in a wavelength region that mainly is decided by the bandgap between the conduction band edges and the valence band edges of the quantum wells 30, but this region is also influenced by the width and the material composition of the quantum wells 30, as will be described later.

Figure 3:
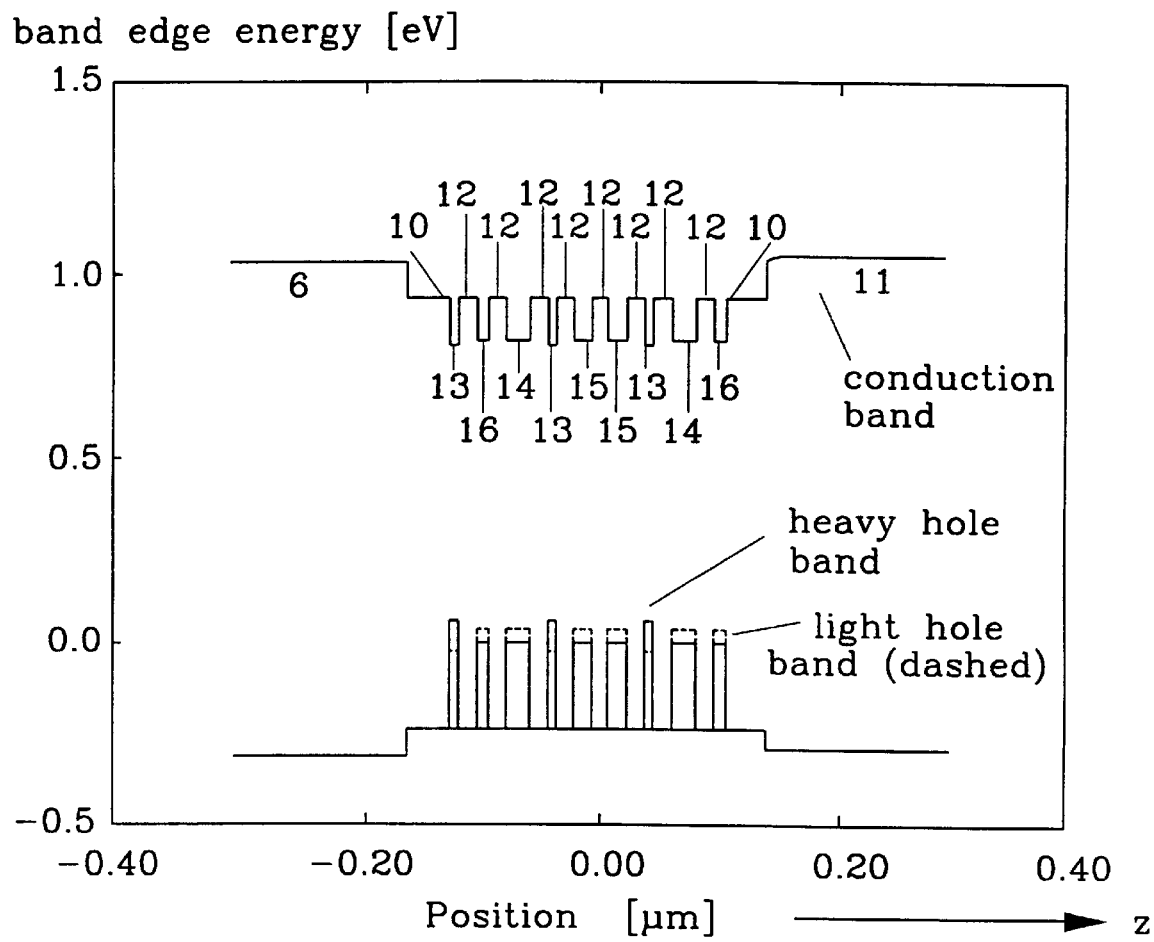
FIG. 3 shows the energy diagram for a laser amplifier according to a preferred embodiment of the present invention.

In FIG. 3 the energy diagram for a preferred embodiment of the present invention is shown. The structure according to FIGS. 2a and 2b is also applicable for this structure. The laser amplifier according to the invention is made in the InGaAsP material structure. However other material structures are conceivable.

The structure according to the preferred embodiment of the invention will be explained with reference to the upper part of FIG. 3, which shows the conduction band. The structure comprises an active region between a substrate 6 and a contact layer 11 both of InP. The active region, which is made of the $In_{1-x}Ga_xAs_yP_{1-y}$ material system comprises quantum wells 13 of the second type having compressive strain and wells 14, 15 and 16 of the first type having tensile strain. The wells 13 of the second type are three and all have a width of 7 nm and material composition parameters x=0.13 and y=0.72. Two wells 14 of the first type have a width of 20 nm and material composition parameters x=0.55 and y=1, two wells 15 of the first type have a width of 15 nm and material composition parameters x=0.55 and y=1 and two wells 16 of the first type have a width of 10 nm and material composition parameters x=0.55 and y=1. The wells are separated by barriers 12 having a width of 15 nm and material composition parameters x=0.12 and y=0.25. Two additional wider barrier layers 10 with the same material composition parameters are provided between the wells and the substrate 6 and the wells and the contact layer 11, respectively, which gives a total width of the active region of approximately 0.3 μm.

The active region was formed in the following way according to a method according to the invention. First the wide barrier 10 was grown on the substrate 6. On top of this wide barrier 10 quantum wells 13, 14, 15, 16 were grown alternating with barriers 12. The barriers 12 were all grown to a width of 15 nm. The well layers were grown in the following way and order in the growth direction z: a well of the second type 13 to a width of 7 nm, a well of the first type 16 to a width of 10 nm, a well of the first type 14 to a width of 20 nm, a well of the second type 13 to a width of 7 nm, a well of the first type 15 to a width of 15 nm, a well of the first type 15 to a width of 15 nm, a well of the second type 13 to a width of 7 nm, a well of the first type 14 to a width of 20 nm and a well of the first type 16 to a width of 10 nm. On top of this last well 16 of the first type a second wider barrier 10 was grown and finally a contact layer was formed on the second wide barrier 10.

The lower part of the diagram in FIG. 3 shows the energy levels of the structure for the valence band of the active layer. For each well there exist two different energy levels, one for light holes, shown with dashed lines, and one for heavy holes, shown with solid lines. These different levels occur because of the strain, which is well known for the person skilled in the art.

Figure 4:
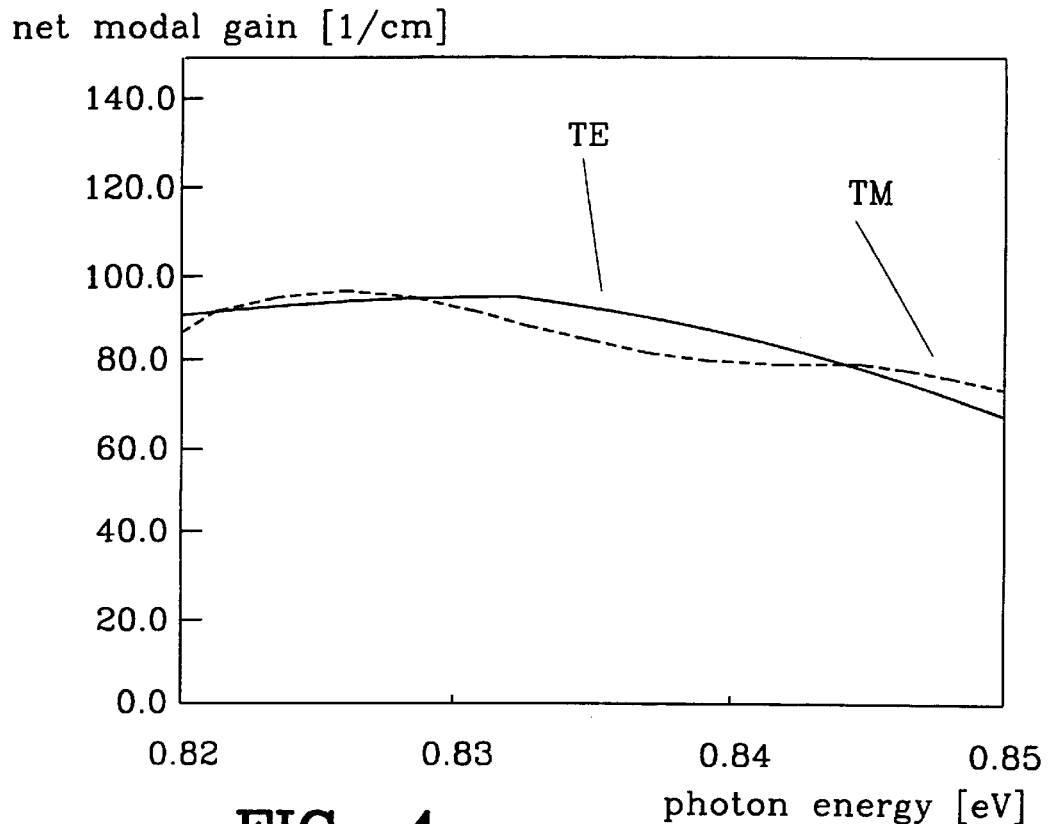
FIG. 4 shows a diagram of the gain in dependence of the photon energy in the laser amplifier according to the preferred embodiment of the present invention.
Figure 5:
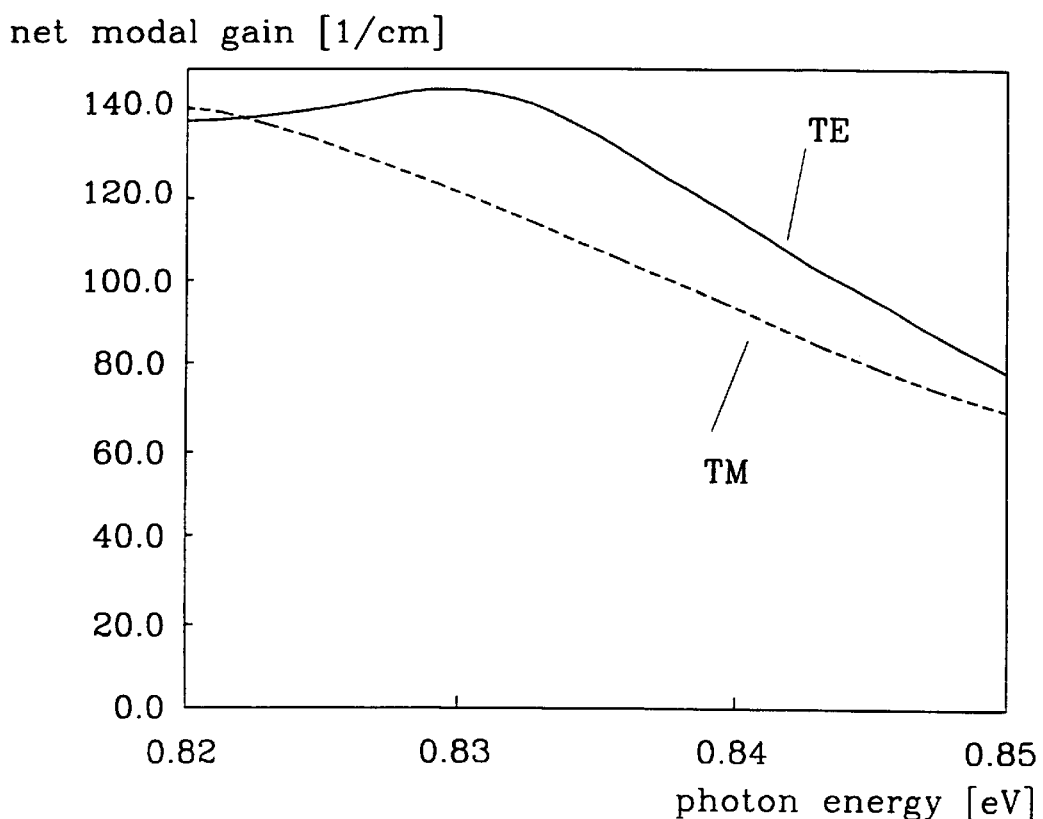
FIG. 5 shows a diagram of the gain in dependence of the photon energy in a laser amplifier according to the prior art.

FIG. 4 shows the gain of the TE- and TM-modes in dependence of the photon energy for the laser amplifier with the structure according to FIG. 3. The TM-mode is shown with a dashed line and the TE-mode is shown with a solid line. The gain is expressed in $cm^{-1}$ and the photon energy, which is inversely proportional to the wavelength, in eV. As a comparison FIG. 5 shows the gain in the same photon energy region (corresponding to the desired wavelength region) in a laser amplifier according to the prior art having a structure of four wells of the second type, each having a width of 7 nm and material composition parameters x=0.13, y=0.72, and five wells of the first type, each having a width of 20 nm and material composition parameters x=0.55 and y=1. In the figure the TM-mode gain is also shown with a dashed line and the TE-mode gain in a solid line.

As can be seen from FIGS. 4 and 5 the amplification in the laser amplifier according to the invention has a more even amplification over the desired wavelength region than the laser amplifier according to the prior art. The TE- and TM-modes are also amplified with substantially equal gain in the wavelength region by the amplifier according to the invention.

This can also be expressed through the equation below:

$$\max[(g_{TE}-g_{TM})/(g_{TE}+g_{TM})] \quad (1)$$

The maximum value according to above equation is calculated as 0.11 for the laser amplifier of the prior art and as 0.044 for the laser amplifier according to the invention, which is a considerable improvement of more than 100%.

In the embodiment of the invention shown above the active region included wells of both the first and the second type separated by barrier layers. In another embodiment of the laser amplifier the active region only includes wells of the first type with just a slight strain (a few tenths of a percent) that are separated by barrier layers. Moreover, in the described preferred embodiment of the invention only the widths of the wells of the first type have been varied. The material compositions of said wells could just as well have had been varied as well as a combination of width variation and material composition variation. The compressive wells could also have had varied widths and/or material compositions. Finally the active region could have had more or fewer wells in the structure, both in number of wells of the first type as well as wells of the second type.

Figure 6:
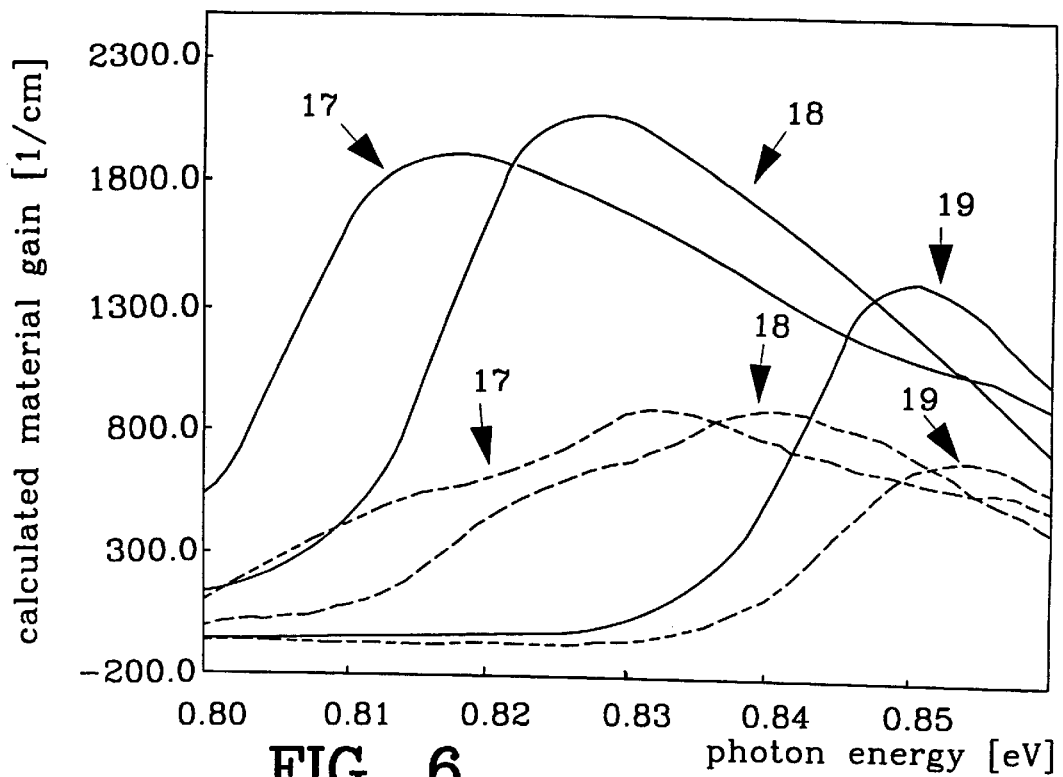
FIG. 6 shows curves of the gain in dependence of the photon energy for quantum wells with tensile strain having different widths and, FIG. 7 shows curves of the gain in dependence of the photon energy for quantum wells with compressive strain having different widths and material compositions.
Figure 7:
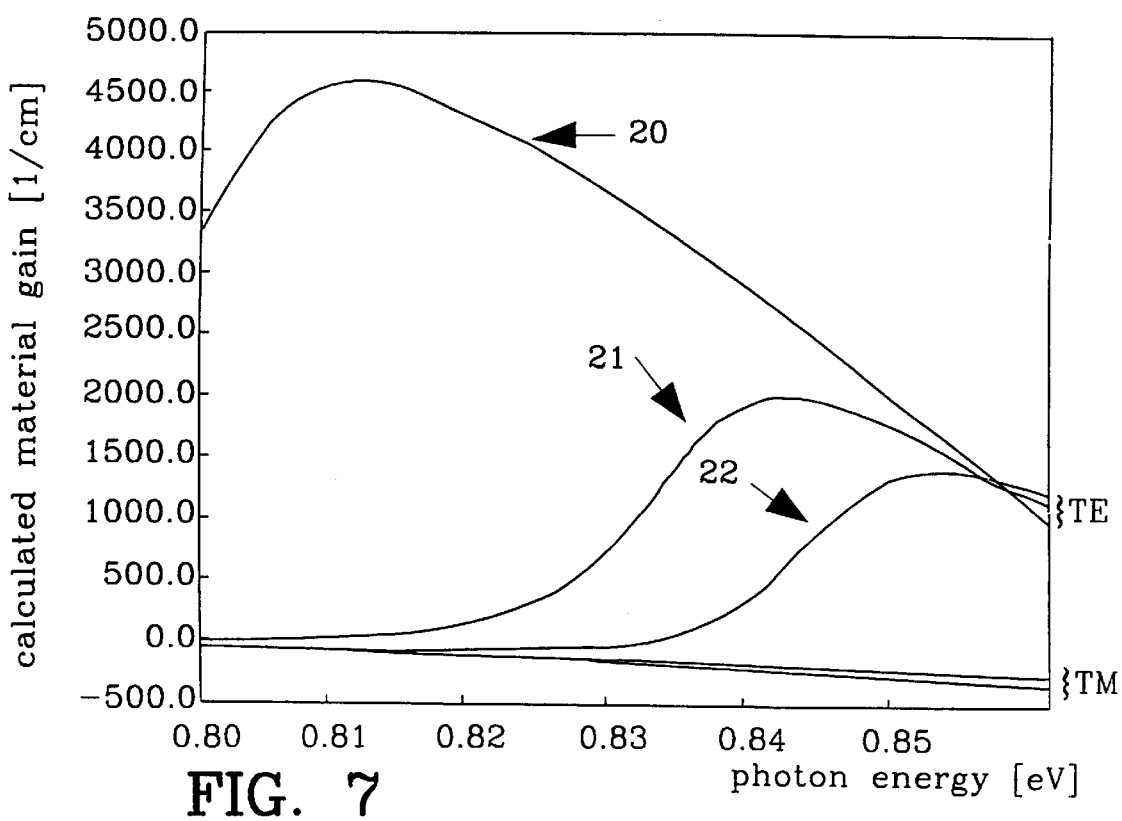

In order to further clarify how variations of width and material composition can be made in laser amplifiers according to the invention, reference is being made to FIGS. 6 and 7. FIGS. 6 and 7 are curves that show the gain contributions obtained through choice of material composition and width of the wells.

FIG. 6 shows the contributions 17, 18 and 19 to the amplification of the TE- and TM-modes from quantum wells of the first type having widths of 20 nm, 15 nm and 10 nm, respectively and material parameters x=0.55 and y=1. The contributions to the TE-gain is shown with dashed lines and the contributions to the TM-gain with solid lines. As can be seen the wells of the first type mainly contribute to the TM-gain, but a certain contribution to the TE-gain is also achieved. As is also apparent from the curves, the different widths result in gain peaks for different wavelengths and the larger widths contribute mostly to the lower photon energy levels and the smaller widths to the higher photon energy levels. A change of material composition (not shown) also changes the gain peaks. A slight increase of the x-parameter (say from 0.55 to 0.56) and a slight decrease of the y-parameter (say from 1 to 0.98) would give a gain contribution at a higher photon energy level, and a slight decrease of the x-parameter (say from 0.55 to 0.54), with the y-parameter kept at y=1 (can not be more than 1) would give a contribution to a lower photon energy level.

FIG. 7 shows the gain contributions from the wells of the second type. Here the contributions from a well 20 having a width of 7 nm and material parameters x=0.13 and y=0.72, a well 21 having a width of 7 nm and material parameters x=0.15, y=0.70 and a well 22 having a width of 6 nm and material parameters x=0.15, y=0.70 are shown. As can be seen from the figure the contributions to the TM-mode for these wells is almost negligible. The different widths also give gain peaks at different wavelengths, where the larger widths give peaks at lower photon energy levels than at smaller widths. A higher x-parameter and a lower y-parameter also shifts the peaks to a higher photon energy level.

As can thus be seen from FIGS. 6 and 7, a gain peak is shifted towards lower photon energy levels by increasing the width of a well and vice versa. The material composition can be varied in the same way.

In order to achieve polarization independent amplification in a desired wavelength region one picks a known laser amplifier structure that amplifies well in say the middle of the desired region and then widths and/or material compositions of the quantum wells are varied in above mentioned manner to obtain the desired wavelength region.

However there exists certain limits for this active region. The number of wells that can be included in an active region according to the invention is restricted in the following way.

The absolute value of a layer product, which is defined as the width of a layer multiplied with the strain of said layer, is less than 20 nm percent, when the width is expressed in nm and the strain in percent. In addition to this the following requirement must be fulfilled. The absolute value of any sum of layer products for consecutive layers is less than 20 nm percent. The tensile strain is here defined as having a positive sign and the compressive strain as having a negative sign, although the opposite signs might just as well have been chosen. This means that no absolute value of any sum of layer products $t_1 s_1, t_1 s_1 + t_2 s_2, \ldots, t_1 s_1 + t_2 s_2 + \ldots + t_n s_n$ for n consecutive layers can be more than 20 nm percent. In above expressions $t_n$ indicates the width of a layer and $s_n$ the strain of said layer.

For the structure according to the preferred embodiment of the present invention the layer products are as follows.

The wells 13 of the second type have a strain of about −1.59 percent, the wells 14, 15, 16 of the first type have a strain of about 0.45% and the barrier layers 10, 12 lack strain.

The layer product for each well 13 of the second type is then 7*(−1.59)=−11.13 nm percent and the layer products for the wells of the first type 14, 15, 16 are then 20*0.45=9 nm percent, 15*0.45=6.75 nm percent and 10*0.45=4.5 nm percent, respectively. The layer products of the barriers are all zero since they lack strain. As can be seen all the layer products meet above mentioned requirement.

As can thus be seen through summing the layer products of any combination of consecutive layers in the active region, the absolute value of any such sum is always less than 20 nm percent.

I claim:

1. A method for forming a laser amplifier comprising:
   forming of active region on a semiconductor substrate, the forming of the active region comprising growing of well layers alternating with barrier layers, the well layers comprising well layers of a first type having tensile strain together with or without well layers of a second type having compressive strain, wherein at least one of the well layers of one type is grown to a different width and/or with a different material composition than the other well layers of the same type.

2. The method of claim 1, wherein the well layer of one type that differs from the other well layers of the same type is grown in such a way that a gain enhancement is achieved in at least one wavelength region that at least partly differs from the wavelength region where the gain peak for the other well layers of the active region is located.

3. The method of claim 1, wherein at least one first well layer of one type is grown to a width that is about half the width of the other well layers of the same type.

4. The method of claim 3, wherein at least one second well layer of the same type as the first well layer, is grown to a width between the width of the first well layer and the width of the other well layers of the same type.

5. The method of claim 1, wherein each layer in the active region is grown without strain or with such a strain and to such a width that the absolute value of a layer product for said layer is less than 20 nm percent, the layer product being the width of a layer multiplied with the strain of said layer and the width being expressed in nm and the strain in percent.

6. The method of claim 5, wherein the layers in the active region are grown without strain or with such a strain and to such a width that the absolute value of any sum of layer products for consecutive layers is less than 20 nm percent.

7. A laser amplifier with an active region comprising:
   quantum well layers separated by barrier layers, the well layers comprising well layers of a first type having tensile strain together with or without well layers of a second type having compressive strain, wherein at least one of the well layers of one type has a different width and/or a different material composition than the other well layers of the same type.

8. The laser amplifier of claim 7, wherein the well layer of one type that differs from the other well layers of the same type is chosen in such a way that a gain enhancement is achieved in at least one wavelength region that at least partly differs from the wavelength region where the gain peak for the other well layers of the active region is located.

9. The laser amplifier of claim 7, further comprising:
   at least one first well layer of one type and with differing width, the width being about half the width of the other well layers of the same type.

10. The laser amplifier of claim 9, further comprising:
    at least one second well layer with differing width and of the same type as the first well layer, the width of the second well layer being between the width of the first well layer and the width of the other well layers of the same type.

11. The laser amplifier of claim 7, wherein the absolute value of a layer product for a layer in the active region, comprising the width of the layer multiplied with the strain of said layer, is less than 20 nm percent, where the width is expressed in nm and the strain in percent.

12. The laser amplifier of claim 11, wherein the absolute value of any sum of layer products for consecutive layers is less than 20 nm percent.

13. An optical system comprising:
    a laser source;
    at least one optical fiber; and
    at least one laser amplifier, the laser amplifier comprising an active region comprising quantum well layers separated by barrier layers, the well layers comprising well layers of a first type having tensile strain together with or without well layers of a second type having compressive strain,
    wherein at least one of the well layers of one type in the laser amplifier has a different width and/or a different material composition than the other well layers of the same type in the laser amplifier.

14. The optical system of claim 13, wherein the well layer of one type that differs from the other well layers of the same type in the laser amplifier is chosen in such a way that a gain enhancement is achieved in at least one wavelength region that at least partly differs from the wavelength region where the gain peak for the other well layers in the laser amplifier is located.

15. The optical system of claim 13, further comprising:
    at least one first well layer of one type and with differing width in the laser amplifier, the width being about half the width of the other well layers of the same type in the laser amplifier.

16. The optical system of claim 15, further comprising:
    at least one second well layer with differing width in the laser amplifier and of the same type as the first well layer, the width of the second well layer being between the width of the first well layer and the width of the other well layers of the same type in the laser amplifier.

17. The optical system of claim 13, wherein the absolute value of a layer product for a layer in the active region of the laser amplifier, comprising the width of a layer multiplied with the strain of said layer, is less than 20 nm percent, the width being expressed in nm and the strain in percent.

18. The optical system of claim 17, wherein the absolute value of any sum of layer products for a laser amplifier is less than 20 nm percent for any consecutive layers.

19. A method for forming a laser amplifier comprising:
    forming an active region on a semiconductor substrate, the forming of the active region comprising growing of well layers alternating with barrier layers, the well layers comprising well layers of a first type having tensile strain together with or without well layers of a second type having compressive strain;
    wherein at least one of the well layers of one type is grown to a different width or with a different material composition than the other well layers of the same type.

20. A method for forming a laser amplifier comprising:

forming an active region on a semiconductor substrate, the forming of the active region comprising growing of well layers alternating with barrier layers, the well layers comprising well layers of a first type having tensile strain together with or without well layers of a second type having compressive strain;

wherein at least one of the well layers of one type is grown to a different width and with a different material composition than the other well layers of the same type.

21. A laser amplifier with an active region comprising:

quantum well layers separated by barrier layers, the well layers comprising well layers of a first type having tensile strain together with or without well layers of a second type having compressive strain;

wherein at least one of the well layers of one type has a different width or a different material composition than the other well layers of the same type.

22. A laser amplifier with an active region comprising quantum well layers separated by barrier layers, the well layers comprising well layers of a first type having tensile strain together with or without well layers of a second type having compressive strain;

wherein at least one of the wall layers of one type has a different width and a different material composition than the other well layers of the same type.

23. An optical system comprising:

a laser source;

at least one optical fiber; and at least one laser amplifier, the laser amplifier comprising an active region comprising quantum well layers separated by barrier layers, the well layers comprising well layers of a first type having tensile strain together with or without well layers of a second type having compressive strain;

wherein at least one of the well layers of one type in the laser amplifier has a different width or a different material composition than the other well layers of the same type in the laser amplifier.

24. An optical system comprising:

a laser source;

least one optical fiber; and at least one laser amplifier, the laser amplifier comprising an active region comprising quantum well layers separated by barrier layers, the well layers comprising well layers of a first type having tensile strain together with or without well layers of a second type having compressive strain;

wherein at least one of the well layers of one type in the laser amplifier has a different width and a different material composition than the other well layers of the same type in the laser amplifier.

25. A method for forming a laser amplifier comprising:

forming an active region on a semiconductor substrate, the forming of the active region comprising growing of well layers alternating with barrier layers, the well layers comprising well layers of a first type having tensile strain and well layers of a second type having compressive strain;

wherein at least one of the well layers of said first type or said second type is grown to a different width or with a different material composition than other well layers of the same type.

26. A laser amplifier with an active region comprising:

quantum well layers separated by barrier layers, the well layers comprising well layers of a first type having tensile strain and well layers of a second type having compressive strain;

wherein at least one of the well layers of said first type or said second type has a different width or a different material composition than other well layers of the same type.

* * * * *